United States Patent
Ding (10) Patent No.: US 9,007,132 B2
(45) Date of Patent: Apr. 14, 2015

(54) OSCILLATION SIGNAL GENERATOR

(71) Applicant: MStar Semiconductor, Inc., Hsinchu Hsien (TW)

(72) Inventor: Jian-Yu Ding, Zhubei (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 80 days.

(21) Appl. No.: 13/868,248

(22) Filed: Apr. 23, 2013

(65) Prior Publication Data

US 2013/0278344 A1 Oct. 24, 2013

(30) Foreign Application Priority Data

Apr. 24, 2012 (TW) .............................. 101114607 A (51) Int. Cl.
| | | |
|---|---|---|
| *H03K 3/03* | (2006.01) | |
| *H03B 27/00* | (2006.01) | |
| *H03B 5/12* | (2006.01) | |
| *H03L 7/23* | (2006.01) | |

(52) U.S. Cl.
CPC . *H03B 27/00* (2013.01); *H03L 7/23* (2013.01); *H03B 5/1228* (2013.01); *H03B 5/1212* (2013.01); *H03B 5/1243* (2013.01); *H03B 5/1221* (2013.01)

(58) Field of Classification Search
CPC ...................................................... H03L 7/087
USPC ............ 327/115, 117, 156, 146, 295; 331/45, 331/49, 46, 57, 2; 375/376
See application file for complete search history.

(56) References Cited

U.S. PATENT DOCUMENTS

| | | | |
|---|---|---|---|
| 6,441,667 B1 * | 8/2002 | Boerstler et al. .............. 327/295 |
| 8,086,188 B2 * | 12/2011 | Tanaka et al. .................. 455/73 |
| 8,508,308 B2 * | 8/2013 | Dong et al. .................... 331/179 |
| 8,736,384 B2 * | 5/2014 | Ravi et al. ..................... 331/1 A |
| 2005/0237117 A1 * | 10/2005 | Vu et al. ............................ 331/2 |
| 2006/0078079 A1 * | 4/2006 | Lu ................................. 375/376 |

* cited by examiner

*Primary Examiner* — Arnold Kinkead
(74) *Attorney, Agent, or Firm* — Edell, Shapiro & Finnan, LLC (57) ABSTRACT

An oscillation signal generator includes a quadrature voltage-controlled oscillator (QVCO), a phase corrector and a frequency adjusting circuit. The QVCO provides multiple oscillation signals having difference phases. The phase corrector selects one of the oscillation signals as a first oscillation signal and outputs the first oscillation signal from a first output terminal, and selects one of the oscillation signals as a second oscillation signal and outputs the second oscillation signal from a second output terminal. A phase difference between the first and second oscillation signals satisfies a predetermined relationship. The frequency adjusting circuit is coupled to the phase corrector, and generates a quadrature signal and an in-phase signal according to the oscillation signals. The frequency of the oscillation signals is a non-integral multiple of the frequencies of the quadrature and in-phase signals.

14 Claims, 5 Drawing Sheets

OSCILLATION SIGNAL GENERATOR

This application claims the benefit of Taiwan application Serial No. 101114607, filed Apr. 24, 2012, the subject matter of which is incorporated herein by reference.

BACKGROUND OF THE INVENTION

1. Field of the Invention

The invention relates in general to wireless communication, and more particularly to a method and technique for mitigating frequency pulling for a voltage-controlled oscillator (VCO).

2. Description of the Related Art

In wireless communication, a signal to be transmitted is basically generated in a signal having a relatively low frequency. The relatively low frequency is commonly referred to as baseband. With a certain process, the baseband signal is attached in a radio-frequency (RF) signal having a relatively high frequency and transmitted. Such process is referred to as up-conversion, which is performed by a transmitter in an RF transceiver. Conversely, an opposite process is referred to as down-conversion, which is performed by a receiver in the RF transceiver. Both up-conversion and down-conversion require local oscillation (LO) signals having correct phases. The LO signals can be generated by a voltage-controlled oscillator (VCO) having a good oscillation stability and associated circuits.

The oscillation stability of a VCO may be interfered by normal operations of nearby devices. Such interference is substantially categorized into two types—frequency pushing and frequency pulling. Frequency pushing is a frequency change in a signal of the VCO caused by an unstable voltage of a power line or a ground line of the VCO. Factors incurring the frequency pulling may be a rush current in the nearby components of the VCO, or a coupling effect generated by parasitic resistance, capacitance or inductance of a power line or a ground line. On the other hand, frequency pulling is an effect imposed on an operating frequency of the VCO caused by a large-energy RF signal or harmonics of an RF signal through interactions of electric, magnetic or electromagnetic coupling.

Figure 1:
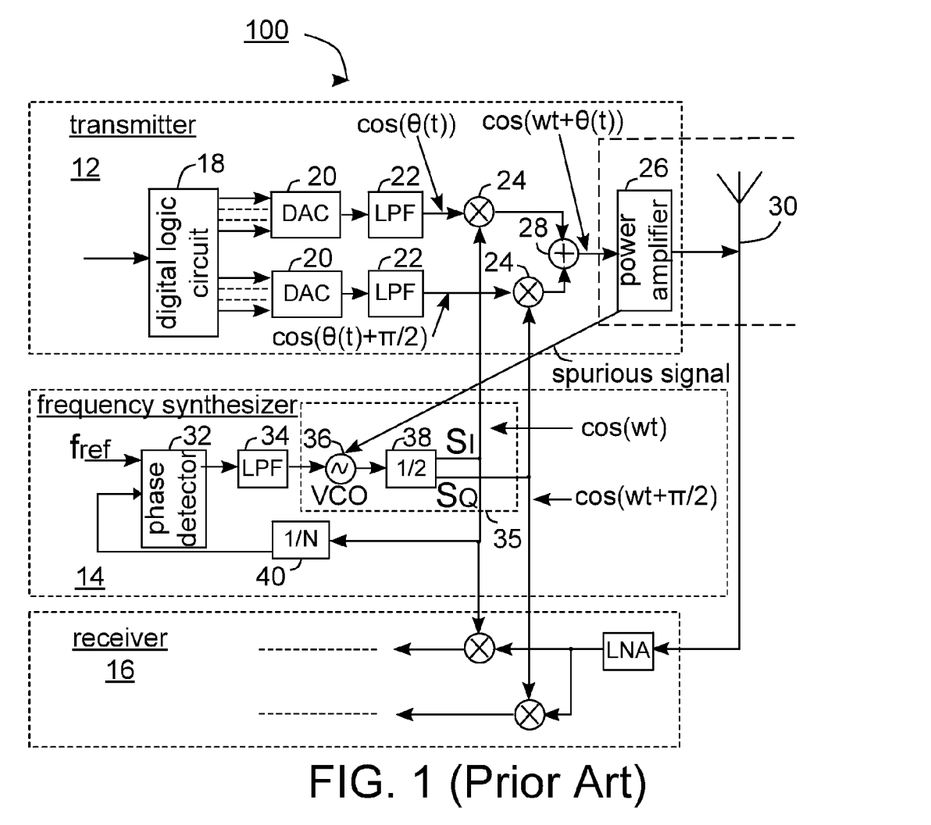
FIG. 1 (prior art) is a direct conversion transceiver.

FIG. 1 shows a direct conversion transceiver 100 comprising a transmitter 12 and a receiver 16. Under efficiency considerations, the transceiver 100 only comprises a frequency synthesizer 14 for providing in-phase/quadrature RF signals $S_I$ and $S_Q$ to be shared by the transmitter 12 and the receiver 16. In other examples, the transmitter 12 and the receiver 16 may respectively have a frequency synthesizer.

The transmitter 12 transmits a message in a digital-bit signal to a digital logic circuit 18. In this example, the digital logic circuit 18 may be multi-functional, e.g., being capable of providing debug computing of a communication signal by being equipped with additional digital bits. For example, the digital logic circuit 18 is also capable of generating quadrature modulation signals according to the digital-bit signal received, i.e., signals $A(n)\cos(\theta(n))$ and $A(n)\cos(\theta(n)+\pi/2)$. Wherein, $A(n)$ and $\theta(n)$ are determined by a modulation type (e.g., phase-shift keying (PSK), frequency-shift keying (FSK) or amplitude-shift keying (ASK)) to be performed by the transmitter 12. Throughout the specification, two quadrature signals refer to two signals with a difference of $\pi/2$ radians or a 90-degree phase.

One of the two modulation signals is sent to an in-phase transmission path while the other is sent to a quadrature-phase transmission path. It is observed from FIG. 1 that, the digital logic circuit 18 ensures that a difference of $\pi/2$ radians or a 90-degree phase exists between the two digital signals on the two paths. On each of the transmission paths, a digital-to-analog converter (DAC) 20 converts the corresponding digital-bit modulation signal sent from the digital logic circuit 18 to an analog modulation signal. The analog modulation signals generated by the DACs 20 are filtered by low-pass filters 22. The filtered analog signals are then ready to be blended by a mixer 24 with an RF signal provided by the frequency synthesizer 14 and up-converted to RF.

The frequency synthesizer 14 provides the two quadrature RF signals (with a difference of $\pi/2$ radians) $S_I$ and $S_Q$ to the two mixers 24 on the in-phase transmission path and the quadrature transmission path, respectively. Results generated by the two mixers 24 are combined by an adder 28 and the combined signal is forwarded to a power amplifier 26 to boost signal strength of the combined signal. The signal processed by the power amplifier 26 is then transmitted to the air via an antenna 30.

In the transceiver 100, the two RF signals $S_I$ and $S_Q$ provided to the mixers are generated by a phase-locked loop (PLL). A phase detector 32 compares a reference signal $f_{ref}$ with a feedback signal generated by the frequency synthesizer 14. Thus, an output signal of the phase detector 32 corresponds to a phase difference between the reference signal $f_{ref}$ and the feedback signal, and is processed by a low-pass filter 34 to generate a control voltage $V_{ctrl}$.

In FIG. 1, a VCO 36 in an oscillation signal generator 35 generates a high-frequency signal having a corresponding oscillation frequency according to the control voltage $V_{ctrl}$. A divider 38 with a divisor of 2 frequency divides the high-frequency signal generated by the VCO 36, and provides the in-phase RF signal $S_I$ and the quadrature signal $S_Q$ that are quadrature to each other to the transmitter 12 and the receiver 16. One of the RF signals $S_I$ and $S_Q$ is frequency divided by the divider 40 having a divisor of N to generate a feedback signal.

The RF signals $S_I$ and $S_Q$ are respectively sent to the mixers 24 on the in-phase transmission path and the quadrature transmission path. The blended results are combined by the adder 28 and then processed by the power amplifier 26 for reinforcing the signal strength. It is known from FIG. 1, assuming the RF signals $S_I$ and $S_Q$ are respectively $\cos(wt)$ and $\cos(wt+\pi/2)$, the large-power RF signal outputted by the power amplifier 26 probably included a $\cos(wt+\theta(t))$ component. Also known from FIG. 1, assuming the RF signals $S_I$ and $S_Q$ are respectively $\cos(wt)$ and $\cos(wt+\pi/2)$, the high-frequency signal generated by the VCO 36 may be represented as $\cos(2wt)$.

Since the fundamental frequency of the large-power RF signal outputted by the power amplifier 26 is w, the harmonic frequency (i.e., an integral multiple frequency of the fundamental frequency) of the large-power RF signal inevitably contains a considerable amount of energy. In FIG. 1, the oscillation frequency (2 w) of the VCO 36 is coincidently the same as one of the harmonic frequencies outputted by the power amplifier 26. As a result, in case of any leakage of the large-power RF signal outputted by the power amplifier 26, the leakage energy becomes a spurious signal. The spurious signal reaches the VCO 36 through the antenna 30 or the electromagnetic coupling effect in the transceiver 100 and to impose pulling effects on the phase of the VCO 36, such that the oscillation stability of the VCO 36 is depreciated.

SUMMARY OF THE INVENTION

According to one embodiment of the disclosure, an oscillation signal generator including a quadrature voltage-controlled oscillator (QVCO), a phase corrector and a frequency adjusting circuit is provided. The QVCO provides a plurality of oscillation signals having difference phases. The phase corrector selects one of the oscillation signals as a first oscillation signal and outputs the first oscillation signal from a first output terminal, and selects one of the oscillation signals as a second oscillation signal and outputs the second oscillation signal from a second output terminal. A phase difference between the first and second oscillation signals satisfies a predetermined relationship. The frequency adjusting circuit is coupled to the phase corrector, and generates a quadrature signal and an in-phase signal according to the oscillation signals. The frequency of the oscillation signals is a non-integral multiple of the frequencies of the quadrature and in-phase signals.

According to another embodiment of the disclosure, an in-phase and quadrature oscillation signal generator including an oscillation signal generator and two fractional dividers is provided. The oscillation signal generator provides a first oscillation signal and a second oscillation signal. A phase difference between the first and second oscillation signals satisfies a predetermined relationship. The two fractional dividers respectively divide the first and second oscillation signals by a predetermined fraction to respectively generate an in-phase signal and a quadrature signal. The phase of the in-phase signal substantially leads the phase of the quadrature signal by 90 degrees.

According to yet another embodiment of the disclosure, a signal processing method is provided. The method includes steps of: providing a plurality of oscillation signals by a QVCO; identifying a phase relationship of the oscillation signals, and selecting two of the oscillation signals as a first oscillation signal and a second oscillation signal, respectively; and processing the oscillation signals to generate a quadrature signal and an in-phase signal. A phase difference between the first and second oscillation signals satisfies a predetermined relationship, and the frequency of the oscillation signals is a non-integral multiple of the frequencies of the in-phase and quadrature signals.

According to yet another embodiment of the disclosure, a method for generating in-phase and quadrature signals is provided. The method includes steps of: providing a first oscillation signal and a second oscillation signal by an oscillation signal generator; and dividing frequencies of the first and second oscillation signals by a predetermined fraction to generate an in-phase signal and a quadrature signal, respectively. A phase difference between the first and second oscillation signals satisfies a predetermined relationship, and the phase of the in-phase signal substantially leads the phase of the quadrature signal by 90 degrees.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 2A:
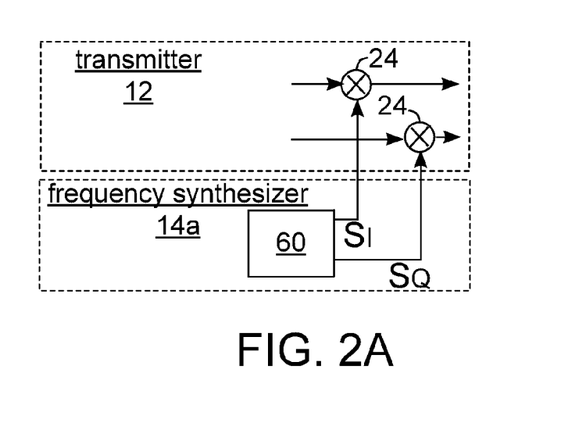
FIG. 2A is a transceiver according to one embodiment of the disclosure.

FIG. 2A shows a transceiver according to one embodiment of the disclosure. The transceiver comprises a transmitter 12 and a frequency synthesizer $14_a$. The frequency synthesizer $14_a$ comprises an oscillation signal generator 60 for providing two RF signals $S_I$ and $S_Q$ that are quadrature to each other and are to be respectively provided to two mixers 24 in the transmitter 12. In the embodiment shown in FIG. 2A, the oscillation signal generator 60 can replace the oscillation signal generator 35 in FIG. 1. For illustrative purposes, the in-phase RF signal $S_I$ and the quadrature RF signal $S_Q$ shall be respectively represented by cos(wt) and cos(wt+π/2) in the descriptions below, inferring that the quadrature RF signal $S_Q$ falls behind the in-phase RF signal $S_I$ by π/2 radians. Throughout the specification, when a signal A falls behind a signal B by X radians, it implies that the phase of the signal A falls behind the phase of the signal B by X*180/π. That is to say, the phase of the quadrature RF signal $S_Q$ falls behind the in-phase RF signal $S_I$ by 90 degrees.

Figure 2B:
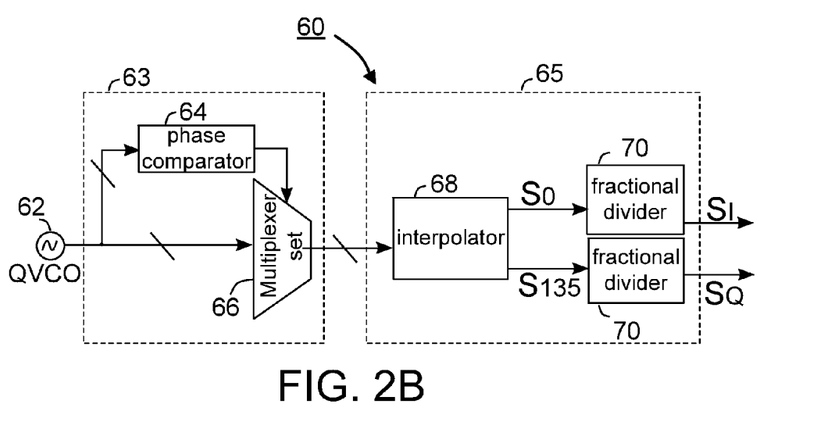
FIG. 2B is an oscillation signal generator in FIG. 2A.

FIG. 2B shows an example of the oscillation signal generator 60 in FIG. 2A. The oscillation signal generator 60 comprises a quadrature voltage-controlled oscillator (QVCO) 62, a phase corrector 63 and a frequency adjusting circuit 65. The frequency adjusting circuit 65 comprises an interpolator 68 and two fractional dividers 70 respectively having a divisor of 1.5.

It is known to a person skilled in the art that, the QVCO 62 is capable of providing four oscillations signals $S_{VCO1}$, $S_{VCO2}$, $S_{VCO1B}$ and $S_{VCO2B}$ having difference phases. Every two of the four oscillation signals $S_{VCO1}$, $S_{VCO2}$, $S_{VCO1B}$ and $S_{VCO2B}$ are either quadrature (with a 90-degree phase difference) or opposite-phased (with a 180-degree phase difference). From the perspective of radian or phase, an oscillation signal leads or falls behind another oscillation signal is determined by initial oscillation conditions of the QVCO 62.

In one embodiment, a phase comparator 64 in the phase corrector 63 is provided to identify a relationship of the phase differences between the oscillation signals, and controls a multiplexer set 66 to sequentially arrange the oscillation signal $S_{VCO1}$, $S_{VCO2}$, $S_{VCO1B}$ and $S_{VCO2B}$ into oscillation signals $S_0$, $S_{90}$, $S_{180}$ and $S_{270}$. Among the oscillation signals $S_0$, $S_{90}$, $S_{180}$ and $S_{270}$, the phase of the subsequent oscillation signal falls behind the phase of the previous oscillation signal by 90 degrees.

The interpolator 68 generates an oscillation signal $S_{135}$ according to the oscillation signals $S_0$, $S_{90}$, $S_{270}$ and $S_{360}$. The phase of the oscillation signal $S_{135}$ falls behind the phase of the oscillation signal $S_0$ by 135 degrees (=3*π/4 radians).

The two dividers 70 respectively divide the frequencies of the oscillation signals $S_0$ and $S_{135}$ by 1.5 to generate an in-phase RF signal $S_I$ and a quadrature RF signal $S_Q$. Thus, assuming the oscillation frequency of the in-phase RF signal $S_I$ and the quadrature RF signal $S_Q$ are w, the oscillation frequency of the QVCO 62 is approximately 1.5 w.

It is learned from the structure in FIGS. 2A and 2B that, the oscillation frequency (the frequency 1.5 w) of the QVCO 62 does not equal any of the baseband (the frequency w) of the large-power RF signal outputted by the transmitter 12 or anyone of the harmonic frequencies (the frequencies 2 w, 3 w and 4 w). Therefore, the structure in FIGS. 2A and 2B effectively mitigates the frequency pulling.

Figure 3:
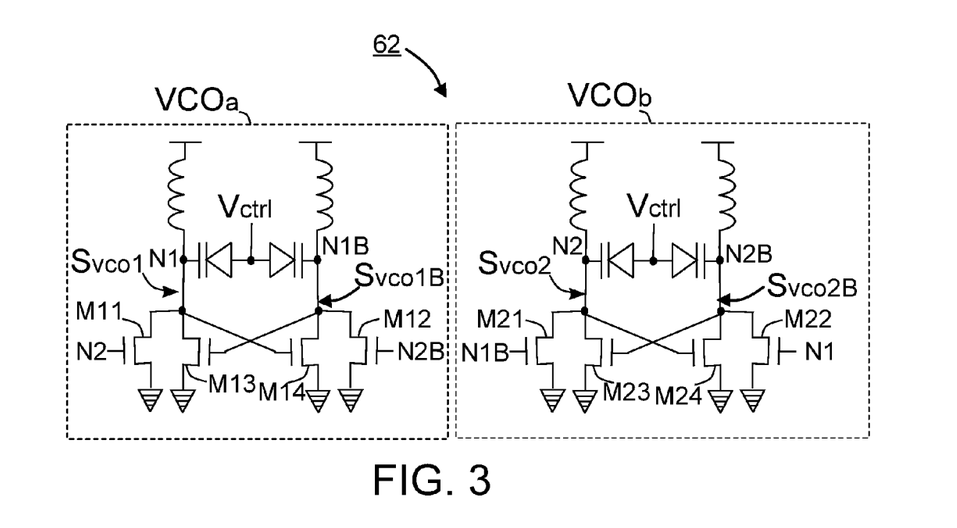
FIG. 3 is an example of a QVCO in FIG. 2B.

FIG. 3 is an example of the QVCO 62 in FIG. 2B. The QVCO 62 comprises a pair of same-structured differential oscillation circuits $VCO_a$ and $VCO_b$. Each of the differential oscillations circuits $VCO_a$ and $VCO_b$ comprises an inductor capacitor oscillator controlled by the control voltage $V_{ctrl}$, and cross-coupled N-type transistors (M13, M14, M23 and M24). Hence, the phase difference between the oscillation signals $S_{VCO1}$ and $S_{VCO1B}$ on nodes N1 and N1B is 180 degrees. Similarly, the phase difference between the oscillation signals $S_{VCO2}$ and $S_{VCO2B}$ on nodes N2 and N2B is also 180 degrees. N-type transistors M11, M12, M21 and M22 provide the two differential oscillation circuits $VCO_a$ and $VCO_b$ with quadrature coupling.

Hence, the phase difference between the oscillation signals $S_{VCO1}$ and $S_{VCO2}$ is 90 degrees. Since the initial oscillation conditions of the differential oscillation circuits may be independent, it is possible that the oscillation signal $S_{VCO1}$ leads the oscillation signal $S_{VCO2}$ by 90 degrees or falls behind the $S_{VCO2}$ by 90 degrees. In other words, the phase difference between the oscillation signals $S_{VCO1}$ and $S_{VCO2}$ may be positive 90 degrees or negative 90 degrees.

Figure 4:
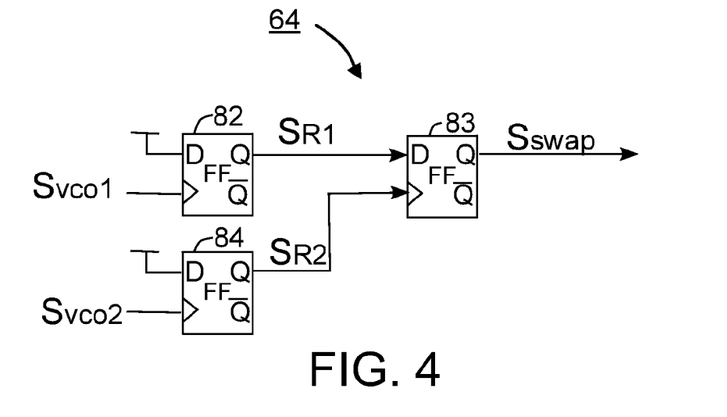
FIG. 4 is an example of a phase comparator in FIG. 2B.
Figure 5A:
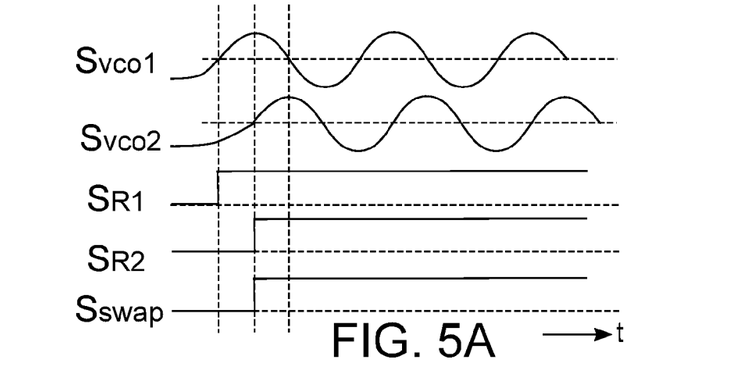
FIGS. 5A and 5B are respectively signal waveforms in FIG. 4 of two different initial states.
Figure 5B:
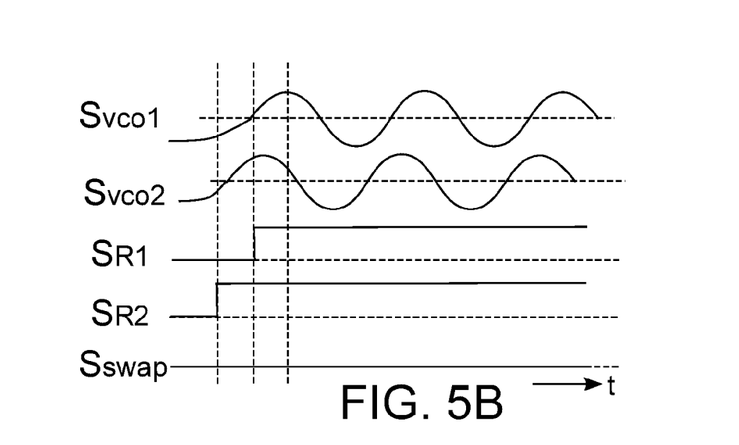

FIG. 4 is an example of the phase comparator 64 in FIG. 2B. The phase comparator 64 comprises three D flip-flops 82, 83 and 84 connected to one another. FIGS. 5A and 5B show signal waveforms of associated signals in FIG. 4 under two different initial states. Referring to FIGS. 5A and 5B, the signal waveforms from top to bottom are the oscillation signal $S_{VCO1}$, the oscillation signal $S_{VCO2}$, a start signal $S_{R1}$, a start signal $S_{R2}$, and a selection signal $S_{swap}$.

As shown in FIG. 5A, the oscillation signal $S_{VCO1}$ leads the oscillation signal $S_{VCO2}$ by 90 degrees. When the oscillation signal $S_{VCO1}$ rises to a certain value, the D flip-flop 82 changes a logic value of the start signal $S_{R1}$ from 0 to 1. Similarly, when the oscillation signal $S_{VCO2}$ rises to a certain value, the D flip-flop 82 changes a logic value of the start signal $S_{R2}$ from 0 to 1. As shown in FIG. 5A, when the start signal $S_{R2}$ changes to logic 1, the logic value of the start signal $S_{R1}$ is already 1, and so the selection signal $S_{swap}$ outputted by the D flip-flop 83 changes from logic 0 to logic 1.

Referring to FIG. 5B, the oscillation signal $S_{VCO1}$ falls behind the oscillation signal $S_{VCO2}$ by 90 degrees. Therefore, when the start signal $S_{R2}$ changes to logic 1, the logic value of the start signal $S_{R1}$ remains at 0, and so the selection signal $S_{swap}$ outputted by the D flip-flop 83 remains at logic 0.

It is known from FIGS. 5A and 5B that, after undergoing one oscillation period, the phase comparator 64 can identify whether the phase of the oscillation signal $S_{VCO1}$ leads or falls behind the phase of the oscillation signal $S_{VCO2}$ to further determine the logic value of the selection signal $S_{swap}$.

Figure 6:
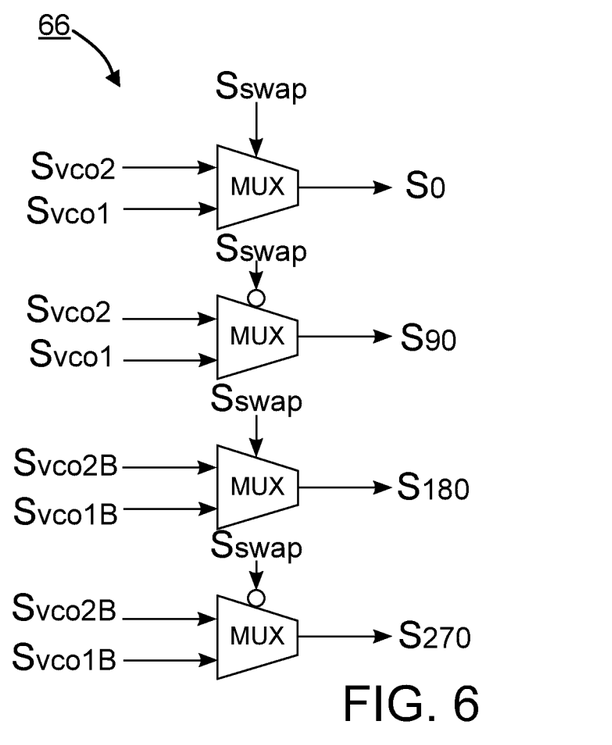
FIG. 6 is an example of a multiplexer set.

FIG. 6 shows an example of the multiplexer set 66. The multiplexer 66 comprises a plurality of multiplexers for reordering the oscillation signals $S_{VCO1}$, $S_{VCO2}$, $S_{VCO1B}$ and $S_{VCO2B}$ into oscillation signals $S_0$, $S_{90}$, $S_{180}$ and $S_{270}$.

When the selection signal $S_{swap}$ is logic 1, it means the oscillation signal $S_{VCO1}$ leads the oscillation signal $S_{VCO2}$ by 90 degrees, and so the multiplexer set 66 selects and outputs the oscillation signals $S_{VCO1}$, $S_{VCO2}$, $S_{VCO1B}$ and $S_{VCO2B}$ as the oscillation signals $S_0$, $S_{90}$, $S_{180}$ and $S_{270}$.

In contrast, when the signal $S_{swap}$ is logic 0, it means the oscillation signal $S_{VCO1}$ falls behind the oscillation signal $S_{VCO2}$ by 90 degrees, and so the multiplexer set 66 selects and outputs the oscillation signals $S_{VCO2}$, $S_{VCO1}$, $S_{VCO2B}$ and $S_{VCO1B}$ as the oscillation signals $S_0$, $S_{90}$, $S_{180}$ and $S_{270}$.

Therefore, regardless of whether the oscillation signal $S_{VCO1}$ leads or falls behind the oscillation signal $S_{VCO2}$, through joint operations of the phase comparator 64 and the multiplexer set 66, it is ensured that among the oscillation signals $S_0$, $S_{90}$, $S_{180}$ and $S_{270}$, the subsequent oscillation signal falls behind the previous oscillation signal by a 90-degree phase (or π/2 radians).

Figure 7:
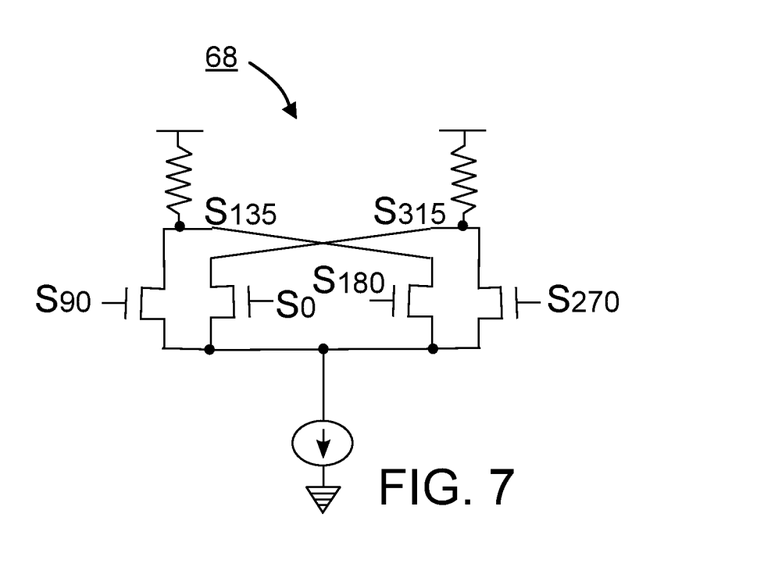
FIG. 7 is an example of an interpolator in FIG. 2B.

FIG. 7 shows an example of the interpolator 68 in FIG. 2B. Referring to the circuit in FIG. 7, the phase of the oscillation signal $S_{135}$ outputted from one terminal of the left resistor is an intermediate value of the radians of the oscillation signals $S_{90}$ and $S_{180}$, and falls behind the phase of the oscillation signal $S_0$ by 135 (=(90+180)/2) degrees. Further, the phase of the oscillation signal $S_{315}$ outputted from one terminal of the right resistor has a difference of 180 degrees from the phase of the oscillation signal $S_{135}$, and falls behind the phase of the oscillation signal $S_0$ by 315 degrees.

Figure 8:
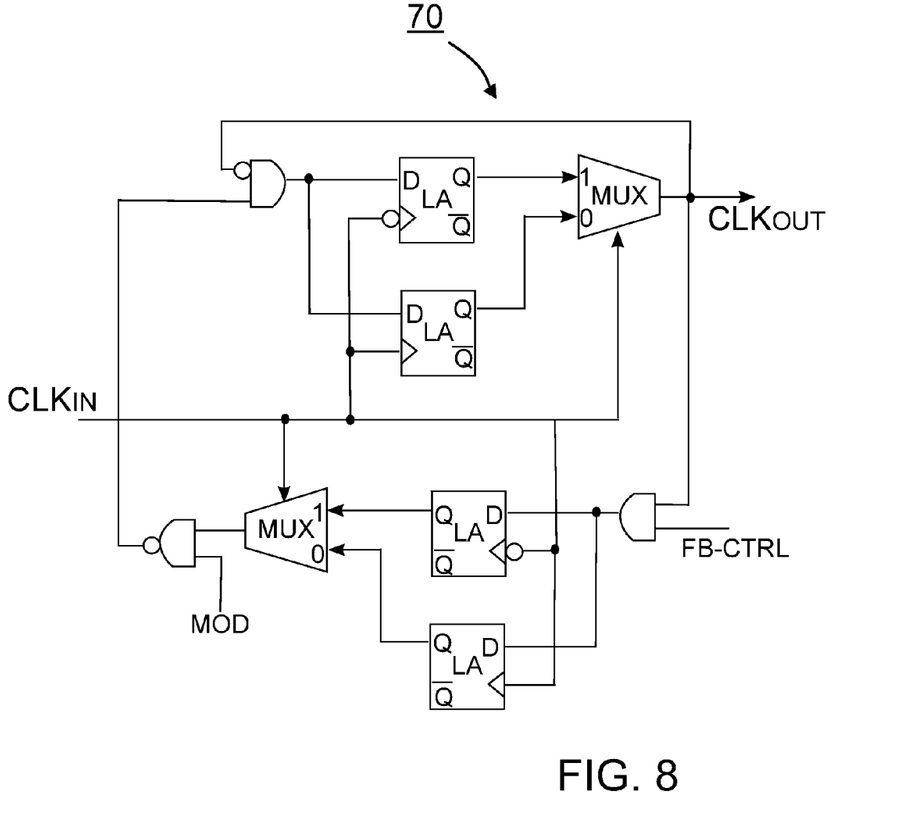
FIG. 8 is an example of a fractional divider having a divisor of 1.5.

Methods for implementing the fractional dividers 70 are known to those skilled in the related art. For example, the U.S. Pat. No. 5,552,732 discloses a clock generator divided by 1.5; the U.S. Pat. No. 5,442,670 discloses a method and apparatus that divides a clock by N.5, where N is a positive integer. FIG. 8 shows an example of a fractional divisor 70. The fractional divider 70 has a divisor of 1.5, and comprises a plurality of D latches, logic gates and multiplexers. Given that a fixed logic level is appropriately provided to control signals MOD and FB-CTRL, the frequency of an output clock signal $CLK_{OUT}$ is two-thirds of the frequency of an input clock signal $CLK_{IN}$.

Again referring to the fractional dividers 70 in FIG. 2B, assume the oscillation signals $S_0$ and $S_{135}$ are respectively cos(1.5*wt) and cos(1.5 wt+3*π/4). After dividing the frequency by 1.5, the RF signals $S_I$ and $S_Q$ outputted by the fractional dividers 70 are respectively cos(wt) and cos(wt+π/2). More specifically, the RF signal $S_I$ indeed leads the RF signal $S_Q$ by π/2 radians (or a 90-degree phase).

A main advantage of implementing the QVCO as an oscillator is that, the QVCO has a rather simple structure, and also has a relatively low phase noise that allows an output oscillation signal to have a waveform approximate to sine waves of a single frequency. The phase corrector 63 identifies the phase relationship between the oscillation signals $S_{VCO2}$ and $S_{VCO1}$ in the QVCO 62 and thus provides oscillation signals having a specific phase difference. The fractional dividers 70 are operable in a way that the fundamental frequency and the harmonic frequencies of the RF signals $S_I$ and $S_Q$ are different from the oscillation frequency of the QVCO 62 to reduce the frequency pulling. In order to allow the fractional dividers 70 to generate the RF signals $S_I$ and $S_Q$ having correct radians, the interpolator 68 provides the oscillation signals $S_0$ and $S_{135}$ having a 135-degree phase difference.

Figure 9:
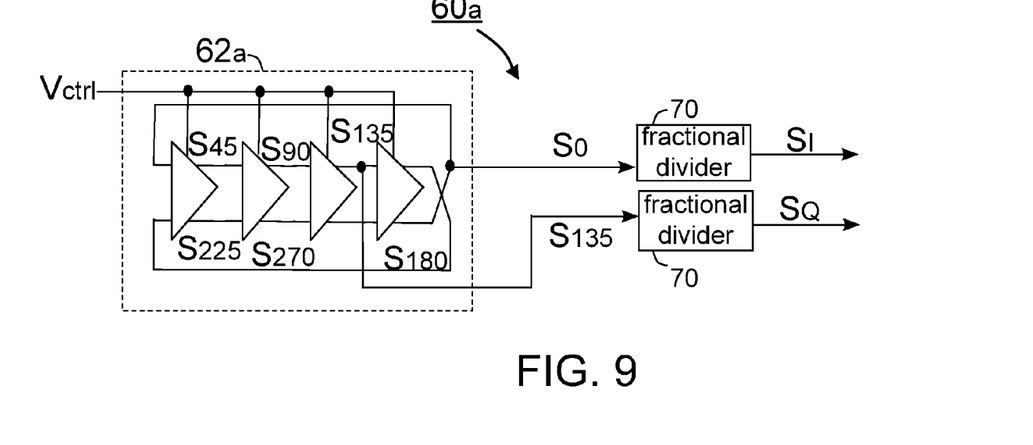
FIG. 9 is another example of an oscillation signal generator.

It should be noted that, methods for generating the oscillation signals $S_0$ and $S_{135}$ having the 135-degree phase difference are not the exemplary combination of the QVCO 62, the phase corrector 63 and the interpolator 68. FIG. 9 shows another oscillation signal generator $60_a$, which adopts a four-stage ring-oscillator for generating the oscillation signals $S_0$ and $S_{135}$. In the oscillation signal generator $60_a$, the four-stage ring-oscillator comprises four stages of retarders. An output of the retarder of each stage falls behind an output of the retarder of a previous stage by a 45-degree phase. Therefore, as shown by the example in FIG. 9, given that an output of a particular stage is selected as the oscillation signal $S_0$, another output as the oscillation signal $S_{135}$ can easily be obtained. The phase of the oscillation signal $S_{135}$ falls behind the phase of the oscillation signal $S_0$ by 135 (=3*45) degrees.

Further, methods for implementing a polyphase filter are known to a person skilled in the related art. In one embodiment of the disclosure, the oscillation signals $S_0$ and $S_{135}$ may also be generated by a combination of a VCO and a polyphase filter.

In yet another embodiment of the disclosure, a four-stage ring-oscillator is adopted to provide the oscillation signals $S_0$ and $S_{225}$ having a 225-degree phase difference. A divider having a divisor of 2.5 frequency divides the oscillation signals $S_0$ and $S_{225}$ to generate RF signals $S_I$ and $S_Q$ to be provided to a transmitter.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An oscillation signal generator, comprising:
   a quadrature voltage-controlled oscillator (QVCO), for providing a plurality of oscillation signals having different phases;
   a phase corrector, for selecting a first oscillation signal from the oscillation signals and outputting the first oscillation signal from a first output terminal, and selecting a second oscillation signal from the oscillation signals and outputting the second oscillation signal from a second output terminal; wherein a phase difference between the first and second oscillation signals satisfies a predetermined relationship; and
   a frequency adjusting circuit, coupled to the phase corrector, for generating a quadrature signal and an in-phase signal according to the first and the second oscillation signals;
   wherein, a frequency of each of the oscillation signals is a non-integral multiple of frequencies of the in-phase signal and the quadrature signal, and
   wherein the phase corrector comprises:
   a phase comparator, for identifying a phase relationship between two oscillation signals of the oscillation signals to generate a selection signal; and
   two multiplexers, for selecting two of the oscillation signals as the first and second oscillation signals according to the selection signal, respectively.

2. The oscillation signal generator according to claim 1, wherein the phase of the first oscillation signal leads the phase of the second oscillation signal by substantially 90 degrees.

3. The oscillation signal generator according to claim 1, wherein the frequency adjusting circuit comprises:
   an interpolator, for generating an interpolation signal according to the first and second oscillation signals; wherein the interpolation signal has a phase between the phases of the first and second oscillation signals; and
   two fractional dividers, for frequency dividing the interpolation signal and a fundamental signal of the oscillation signals by a predetermined fraction to generate the quadrature signal and the in-phase signal, respectively; wherein a phase of the quadrature signal falls behind a phase of the in-phase signal by substantially 90 degrees.

4. The oscillation signal generator according to claim 3, wherein the predetermined fraction is 1.5, and the phase of the interpolation signal falls behind the phase of the fundamental signal by substantially 135 degrees.

5. An in-phase and quadrature oscillation signal generator, comprising:
   an oscillation signal generator, for providing a first oscillation signal and a second oscillation signal; wherein a phase difference between the first and second oscillation signals satisfies a predetermined relationship; and
   two fractional dividers, for frequency dividing the first and second oscillation signals by a predetermined fraction to generate a quadrature signal and an in-phase signal, respectively;
   wherein a phase of the in-phase signal leads a phase of the quadrature signal by substantially 90 degrees,
   wherein the oscillation signal generator comprises:
   a QVCO, for providing a plurality of oscillation signals having different phases;
   a phase corrector, for selecting two of the oscillation signals; and
   an interpolator, for generating the second oscillation signal according to the two selected oscillation signals; wherein the phase of the second oscillation signal is between phases of the two selected oscillation signals.

6. The in-phase and quadrature oscillation signal generator according to claim 5, wherein the predetermined fraction is 1.5, and the phase of the second oscillation signal falls behind the phase of the first oscillation signal by substantially 135 degrees.

7. The in-phase and quadrature oscillation signal generator according to claim 6, wherein the oscillation signal generator is a ring oscillator having four stages of retarders.

8. The in-phase and quadrature oscillation signal generator according to claim 6, wherein the oscillation signal generator comprises a voltage-controlled oscillator (VCO) and a polyphase filter.

9. The in-phase and quadrature oscillation signal generator according to claim 5, wherein the phase corrector selects one of the oscillation signals as the first oscillation signal, the predetermined fraction is 1.5, and the phase of the second oscillation signal falls behind the phase of the first oscillation signal by substantially 135 degrees.

10. A signal processing method, comprising:
    providing a plurality of oscillation signals by a QVCO;
    identifying a phase relationship of the oscillation signals, and selecting two of the oscillation signals as a first oscillation signal and a second oscillation signal according to the phase relationship, respectively; wherein a phase difference between the first and second oscillation signals satisfies a predetermined relationship; and
    processing the first and the second oscillation signals to generate a quadrature signal and an in-phase signal;
    wherein, a frequency of each of the oscillation signals is a non-integral multiple of frequencies of the in-phase signal and the quadrature signal,
    wherein the oscillation signals comprise quadrature second and third oscillation signals, and the steps of identifying the phase relationship comprises:
    generating a selection signal indicative of the phase relationship according to the second and third oscillation signals; and
    generating the first and second oscillation signals according to the selection signal.

11. The signal processing method according to claim 10, further comprising:
    interpolating the first and second oscillation signals to generate an interpolation signal; where a phase of the interpolation signal is between phases of the first and second oscillation signals; and
    frequency dividing a fundamental signal of the oscillation signals and the interpolation signal by a predetermined fraction to generate the quadrature signal and the in-phase signal, respectively; wherein a phase of the in-phase signal leads a phase of the quadrature signal by substantially 90 degrees.

12. A method for generating in-phase and quadrature signals, comprising:
- providing a first oscillation signal and a second oscillation signal by an oscillation signal generator; wherein a phase difference between the first and second oscillation signals satisfies a predetermined relationship; and
- frequency dividing the first and second oscillation signals by a predetermined fraction to generate a quadrature signal and an in-phase signal, respectively; wherein a phase of the in-phase signal leads a phase of the quadrature signal by substantially 90 degrees,
- wherein the predetermined fraction is 1.5, and the phase of the second oscillation signal falls behind the phase of the first oscillation signal by substantially 135 degrees.

13. The method of claim 12, wherein the oscillation signal generator comprising a QVCO for providing a plurality of oscillation signals having different phases, the method further comprising:
- selecting two of the oscillation signals; and
- generating the second oscillation signal according to the two selected oscillation signals; wherein the phase of the second oscillation signal is between phases of the two selected oscillation signals.

14. The method according to claim 12, further comprising:
- selecting one of the oscillation signals as the first oscillation signal.

* * * * *